United States Patent [19]

Koyama

[11] Patent Number: 5,514,910
[45] Date of Patent: May 7, 1996

[54] SEMICONDUCTOR DEVICE HAVING MULTI-LEVEL INTERCONNECTION STRUCTURE

[75] Inventor: Kuniaki Koyama, Tokyo, Japan

[73] Assignee: NEC Corporation, Tokyo, Japan

[21] Appl. No.: 364,226

[22] Filed: Dec. 27, 1994

[30] Foreign Application Priority Data

Dec. 27, 1993 [JP] Japan ................................. 5-330688

[51] Int. Cl.[6] ............................. H01L 29/46; H01L 29/54
[52] U.S. Cl. ..................... 257/768; 257/754; 257/769; 257/770; 257/752; 257/382
[58] Field of Search ................................. 257/768, 763, 257/786, 296, 769, 767, 770, 774, 377, 754, 752, 382

[56] References Cited

U.S. PATENT DOCUMENTS

| | | | |
|---|---|---|---|
| 4,674,173 | 6/1987 | Hahn et al. | 257/517 |
| 4,674,715 | 6/1987 | Lepselter et al. | 257/924 |
| 4,677,735 | 7/1987 | Malhi | 257/382 |
| 4,780,394 | 10/1988 | Blanchard et al. | 257/754 |
| 4,984,039 | 1/1991 | Douglas | 257/296 |
| 5,057,899 | 10/1991 | Samata et al. | 257/754 |
| 5,122,846 | 6/1992 | Haken | 257/904 |
| 5,365,112 | 11/1994 | Ohshima | 257/786 |
| 5,382,817 | 1/1995 | Kashihara et al. | 257/763 |

FOREIGN PATENT DOCUMENTS

| | | |
|---|---|---|
| 63-34954 | 2/1988 | Japan . |
| 3-234062 | 10/1991 | Japan . |

OTHER PUBLICATIONS

B. Davari et al., "A High–Performance 0.25 –μm CMOS Technology: II—Technlogy", IEEE Transactions on Electron Devices, vol. 39, No. 4, Apr. 1992, pp. 967–975.

J. Lasky et al., "Comparison of Transformation to Low–Resistivity Phase and Agglomeration of $TiSi_2$ and $CoSi_2$", IEEE Transactions on Electron Devices, vol. 38, No. 2, Feb. 1991, pp. 262–269.

Primary Examiner—Robert P. Limanek
Assistant Examiner—Alexander Oscar Williams
Attorney, Agent, or Firm—Foley & Lardner

[57] ABSTRACT

A semiconductor device comprises a silicon via-plug within a fine via-hole in direct contact with an inner wall of the via-hole. A metal silicide layer is formed between an interconnection layer and the silicon plug as well as between the silicon plug and a diffused layer formed in a substrate. Shape defects and excessive stresses formed within a fine via-hole are reduced because the via-hole is filled with the silicon plug substantially without a metallic film or a metal silicide film on a sidewall. The metal silicide film is formed by a heat treatment through silicidation reaction.

9 Claims, 6 Drawing Sheets

5,514,910

SEMICONDUCTOR DEVICE HAVING MULTI-LEVEL INTERCONNECTION STRUCTURE

BACKGROUND OF THE INVENTION (a) Field of the Invention

The present invention relates to a semiconductor device and, more particularly, to a semiconductor device having a multi-level interconnection structure.

(b) Description of the Related Arts

It is well known that a silicidation technology of a metallic layer is applicable to reduce either a resistivity of a diffused layer itself or a contact resistance between a contact plug and a diffused layer. FIGS. 1A to 1D illustrate cross-sectional views of a first conventional semiconductor device in consecutive steps of forming a metal silicide structure.

The semiconductor device has a P-type silicon substrate 1, a field oxide film 2 and a gate oxide film 3 formed on a main surface of the substrate 1 as shown in FIG. 1A. An N-type dopant is introduced into the main surface of the substrate 1 to form a diffused layer 4. As a metallic layer 6, a titanium film, for instance, is deposited onto the main surface of the substrate 1 from which the gate oxide film 3 has been removed in a self-aligned manner as shown in FIG. 1B. A metal silicide layer 8 is then formed from the metallic layer 6 by a heat treatment on the N-type diffused layer 4 as shown in FIG. 1C. An unreacted titanium residues 6a are removed from the surface of the field oxide film 2 to form a final metal silicide structure as shown in FIG. 1D.

On the other hand, among the devices that employ a metal silicide layer as an interconnection between multilevel interconnection layers, a second conventional semiconductor device having a metal silicide structure formed by a method including a silicidation reaction is described in Publication No. JP-A-91-234062 as shown in FIGS. 2A–2E. An N-type diffused layer 4 is formed on the main surface of a silicon substrate 1 on which a field oxide film 2 and a gate oxide film 3 are formed as shown in FIG. 2A. As a metallic layer 6, a titanium film, for instance, is deposited covering the main surface from which the gate oxide film 3 has been removed in a self-aligned manner as shown in FIG. 2B. A silicon layer 7 is then deposited covering the main surface and selectively removed out of regions other than the area for local interconnection as shown in FIG. 2C. A heat treatment is then carried out to induce a silicidation reaction among the N-type diffused region 4, the metallic layer 6 and the silicon layer 7 to form a metal silicide layer 8 as shown in FIG. 2D. A removal of unreacted titanium residues 6a completes a silicidation step for the diffused layer 4 and a formation of the local interconnection as shown in FIG. 2E.

FIGS. 3A–3E and FIGS. 4A–4E show a third and a fourth conventional semiconductor devices, respectively, in consecutive steps for fabricating contact electrodes and interconnection layers, which are described in Publication No. JP-A-87-34954.

In the third conventional semiconductor device, a field oxide film 2 and a gate oxide film 3 are formed on a P-type silicon substrate 1 as shown in FIG. 3A. An N-type diffused layer 4 is then formed by introduction of donor impurities. As an interlayer insulating film 5, a chemically vapor deposited (CVD) silicon dioxide ($SiO_2$) film, for instance, is formed, in which a contact-hole 9 (a via-hole used for a first-level interconnection, which will be referred to as a "via-hole" hereinafter) is formed. A metal silicide film 18 such as a titanium silicide film, for instance, is then deposited as shown in FIG. 3B, following which a silicon layer 7 is further deposited as shown in FIG. 3C. An etch-back of the silicon layer 7 is performed to leave a contact plug 7a within the via-hole 9 located on the metal silicide film 18 as shown in FIG. 3D. An etch-removal of the metal silicide film 18 from regions other than interconnection areas completes a final structure of the interconnections as shown in FIG. 3E.

In the fourth conventional semiconductor device as shown in FIGS. 4A to 4E, an N-type diffused layer 4 is formed on a main surface of a P-type silicon substrate 1 on which a field oxide film 2 and a gate oxide film 3 have been formed as shown in FIG. 4A. An interlayer insulating film 5 such as a CVD-$SiO_2$ film is also deposited, through which a via-hole 9 is formed. A metallic layer 6 such as a titanium film is then deposited as shown in FIG. 4B, following which a silicon layer 7 is deposited as shown in FIG. 4C. An etch-back of the silicon layer 7 is performed to leave a contact electrode in the via-hole 9 located on the metallic layer 6 as shown in FIG. 4D. An etch-removal of the metallic layer 6 from regions other than interconnection areas provides a final interconnection structure as shown in FIG. 4E.

The interconnection structures illustrated in FIGS. 3A–3E and FIGS. 4A–4E include a contact electrode electrically connecting an N-type diffused layer 4 with interconnection layers deposited on an interlayer insulating film 5 using either a metallic layer 6 or a metal silicide layer 18 located on the bottom surface and on the sidewall surface of a via-hole 9. However, those conventional device structures have problems which are described later.

SUMMARY OF THE INVENTION

It is an object of the present invention to provide a semiconductor device having a multi-level interconnection structure and improved characteristics thereof.

According to the present invention, there is provided a semiconductor device comprising a silicon substrate, a diffused region formed in the silicon substrate, an insulating film formed on the substrate and having a via-hole on the diffused region, an interconnection layer formed on the insulating film, a silicon plug formed within the via-hole in direct contact with the inner wall of the via-hole, and a first conductive portion made of a metal silicide and formed between the diffused region and the silicon plug, the interconnection layer having a second conductive portion made of the metal silicide in direct contact with the silicon plug.

BRIEF DESCRIPTION OF THE DRAWINGS

The above and further objects as well as features and advantages of the present invention will be more apparent from the following description, taken in conjunction with accompanying drawings in which.

DESCRIPTION OF THE PREFERRED EMBODIMENTS

Figure 1A:
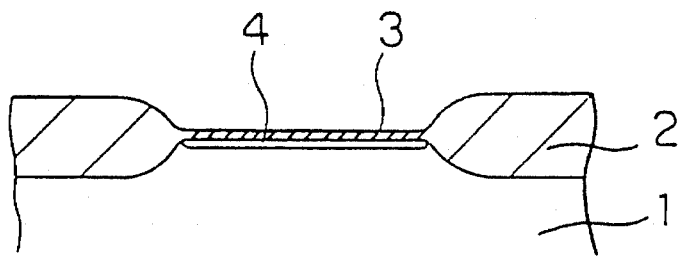
FIGS. 1A–1D are cross-sectional views of a silicide electrode structure in a first conventional semiconductor device.
Figure 1B:
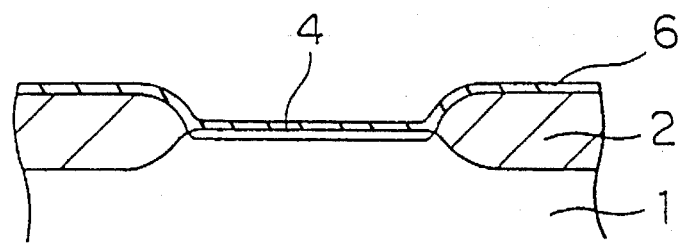
Figure 1C:
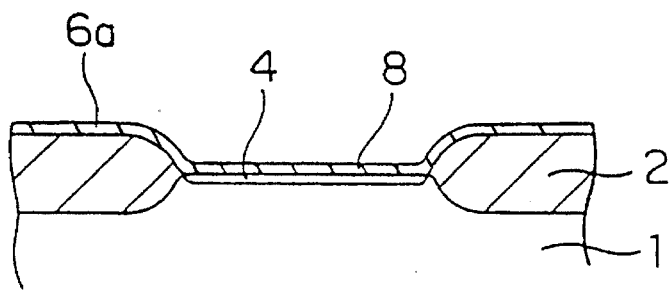
Figure 1D:
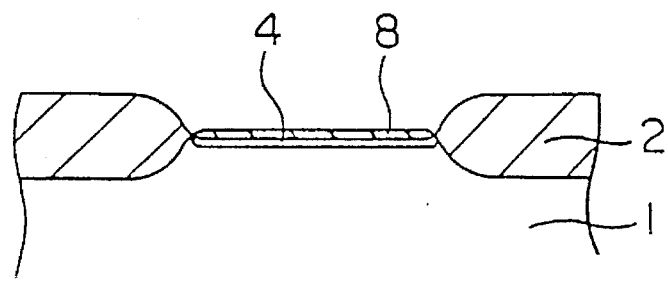
Figure 2A:
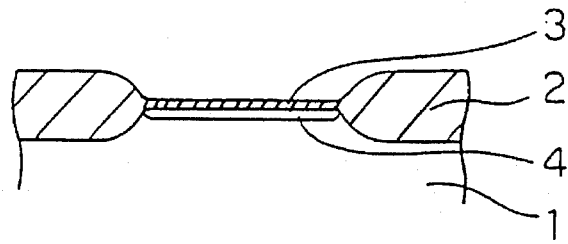
FIGS. 2A–2E are cross-sectional views of a silicide electrode structure in a second conventional semiconductor device.
Figure 2B:
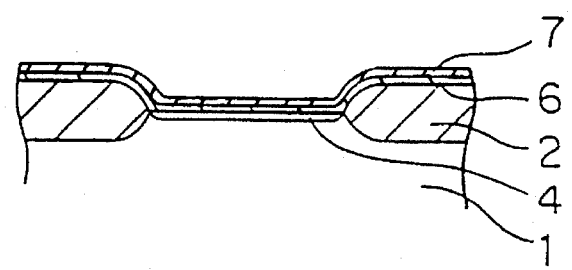
Figure 2C:
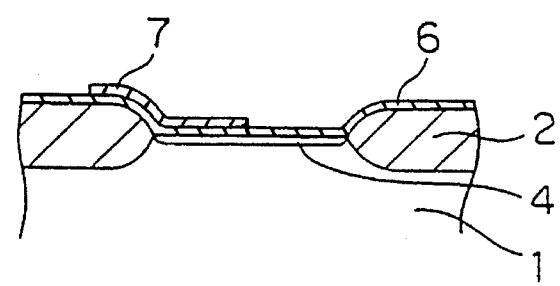
Figure 2D:
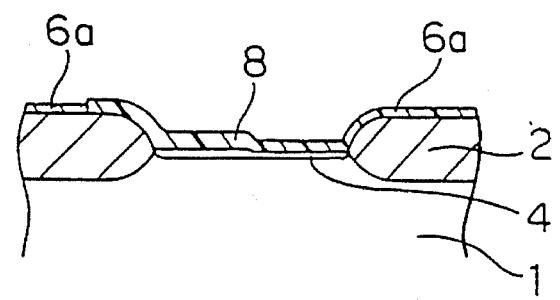
Figure 2E:
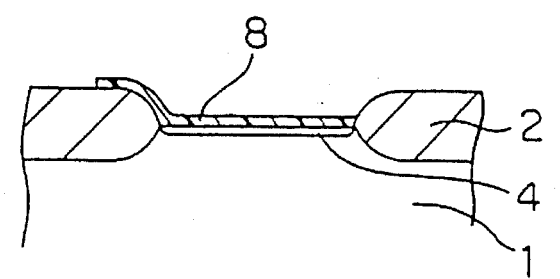
Figure 3A:
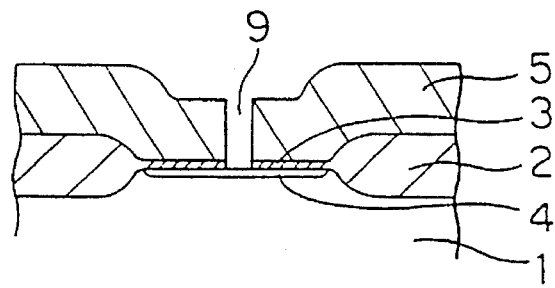
FIGS. 3A–3E are cross-sectional views of a silicide contact electrode and interconnection structure in a third conventional semiconductor device.
Figure 3B:
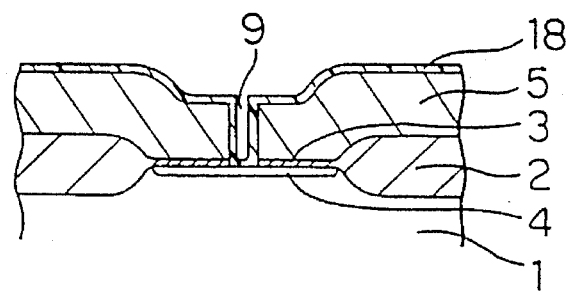
Figure 3C:
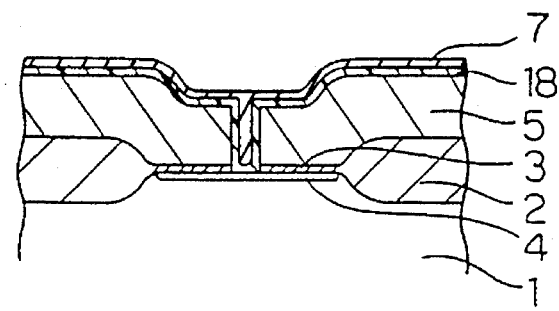
Figure 3D:
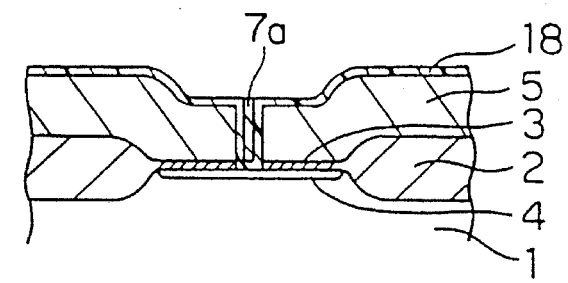
Figure 3E:
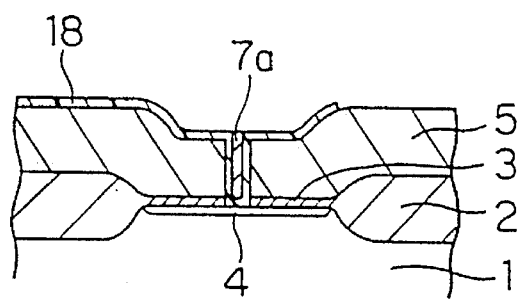
Figure 4A:
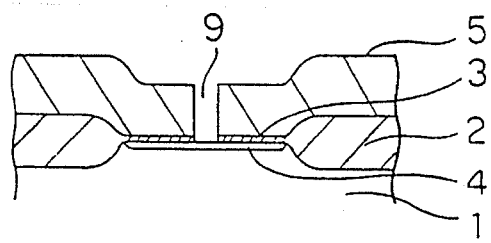
FIGS. 4A–4E are cross-sectional views of a silicide contact electrode interconnection structure in a fourth conventional semiconductor device.
Figure 4B:
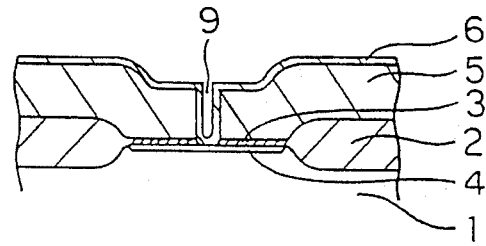
Figure 4C:
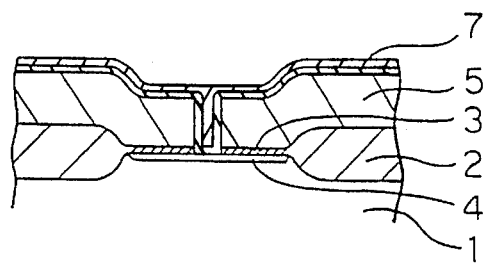
Figure 4D:
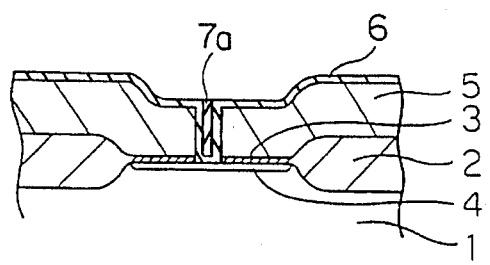
Figure 4E:
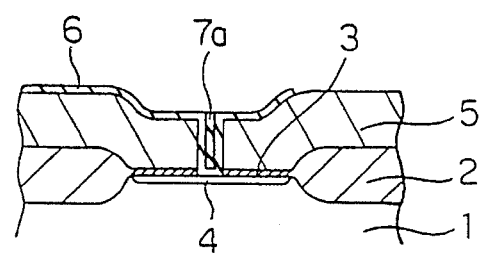

Before describing embodiments of the present invention, problems and disadvantages that the conventional structures encountered will be described for a better understanding of the present invention.

First, the structure as shown in FIGS. 1A–1D encounters a junction leakage current problem accompanied by a silicidation reaction especially in a shallow junction resulting from a high density and high cell number integration of ICs. Such a problem is especially serious in a semiconductor device having a thick silicide film and reported in literatures, for example, IEEE Transactions on Electron Devices, Vol. 39, No. 4, P. 971 (1992).

On the other hand, the structure shown in FIGS. 2A–2E resolve the leakage current problem as described above especially in a plane area including interconnection layers because two silicon layers located both on and beneath the metallic film 6 accelerate a silicidation reaction of the metallic layer. However, the other problems which are to be described below with reference to FIGS. 3A–3B and FIGS. 4A–4E still remain at a contact electrode area.

Main purposes of the third conventional structure shown in FIGS. 3A–3E are to fill up the cavity formed on the contact electrode area with a silicon film 7 for a planarization purpose, the silicon film 7 being compensating a poor step coverage of the metal silicide layer 18, as well as to connect the diffusion area 4 with an overlying interconnection layer. However, the fine structure of via-holes 9 enhances the poor step coverage characteristics of the metal silicide films 18 to thereby generate defects in filling up of the cavity. In addition, there is a high interfacial resistance problem because no silicidation reaction takes place at a contact electrode area between the metal silicide film 18 and the diffused region 4.

The fourth conventional structure as shown in FIGS. 4A–4E also encounters the problem on contact electrodes similarly to the device in FIGS. 3A–3E. The interfacial resistance is also high because the silicidation reaction does not take place between the metallic layer 6 and the diffused region 4.

In the meantime, a combination of the manufacturing process shown in FIGS. 4A–4E with that shown in FIGS. 1A–1D may be employed to enhance a silicidation reaction between the metallic layer 6 and the silicon layer 7 as well as between the diffused region 4 and the silicon layer 7 to thereby reduce the interfacial resistance together with the junction leakage current in a shallow junction. However, such a combination creates various different problems such as excessive junction leakage current, a volume expansion-induced cracks etc., because a rugged or uneven contact electrode area suffers from a large silicidation-induced stress induced on the sidewall of the via-hole on the contrary to the plane portions including interconnection layers as shown in FIGS. 1A–1D.

Furthermore, it is apparent from literatures, for example, IEEE Transactions on Electron Devices, Vol. 38, No. 2, P. 265 (1991) that reduction in the sheet resistance requires a thick titanium film, which would, however, generate cavity-induced shape failures and enhance the silicidation-induced stress.

Now, the embodiments of the present invention will be described with reference to the drawings.

Figure 5:
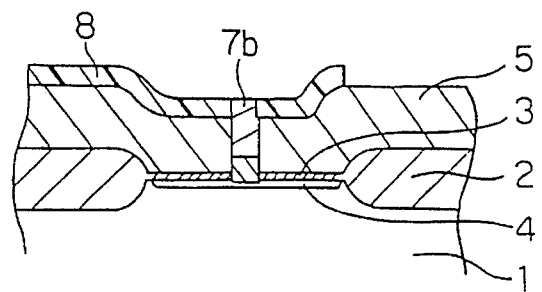
FIG. 5 is a cross-sectional view of a silicide contact electrode and interconnection structure in a semiconductor device according to an embodiment of the present invention.

Referring to FIG. 5, there is shown a structure of semiconductor device according to an embodiment of the present invention. The semiconductor device comprises an N-type diffused region 4 formed in a P-type silicon substrate 1 and a metal silicide layer 8 formed on an interlayer insulator film 5, both of which are electrically connected with each other by a silicon plug 7b deposited within a via-hole 9 in direct contact with the inner wall of the via-hole 9. The structure of the semiconductor device shown in FIG. 5 will be detailed further with manufacturing steps thereof.

Figure 6A:
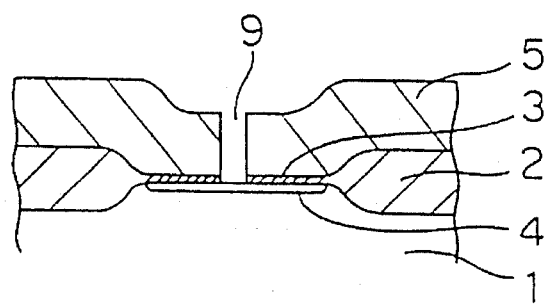
FIGS. 6A–6E are cross-sectional views of a first method for manufacturing the structure shown in FIG. 5.

FIGS. 6A–6E illustrate consecutive steps for manufacturing the semiconductor device of FIG. 5. A 5,000 angstrom (A)-thick field oxide film 2 and a 200 A-thick gate oxide film 3 are formed on a P-type silicon substrate 1 utilizing an ordinary LOCOS process etc. as shown in FIG. 6A. An N-type diffused region 4 is formed by implanting arsenic ions with $1E15/cm^2$ in dosage and 50 keV in acceleration energy into the substrate 1. After depositing a 5000 A-thick CVD-grown $SiO_2$ film, for instance, to form an interlayer insulating film 5, a via-hole 9 of 0.3 μm square in size is formed therein at the location on the N-type diffused region 4.

Figure 6B:
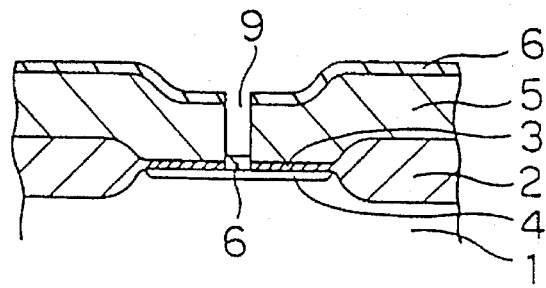

An 800 A-thick titanium film, for instance, is deposited as a metallic film 6 both on the diffused layer 4 exposed from the bottom of the via-hole 9 and on the interlayer insulating film 5 by use of a collimation sputtering technology as shown in FIG. 6B.

Figure 6C:
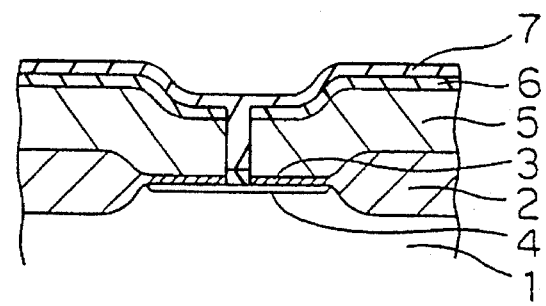

A 2,000A-thick amorphous silicon film, for instance, is deposited at 500° C. as a silicon layer 7 for filling up the via-hole 9 as shown in FIG. 6C.

Figure 6D:
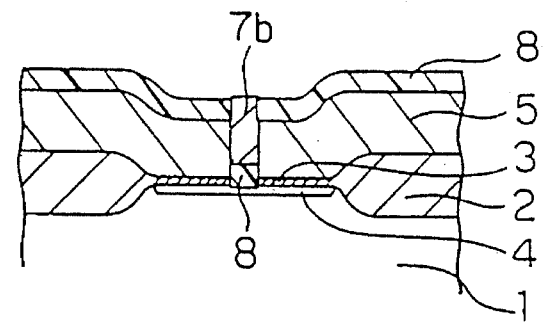

A heat treatment is then performed at 500°–900° C. to induce a silicidation reaction between the N-type diffused region 4 and the silicon layer 7 as well as between the titanium film 6 and the silicon layer 7 to form metal silicide films 8 as shown in FIG. 6D.

Although FIG. 6D illustrates as if the silicon layer 7 located on the interlayer insulating film 5 has reacted entirely with the titanium film 6 to convert itself to the silicide film 8, unreacted silicon may remain on the surface thereof.

Figure 6E:
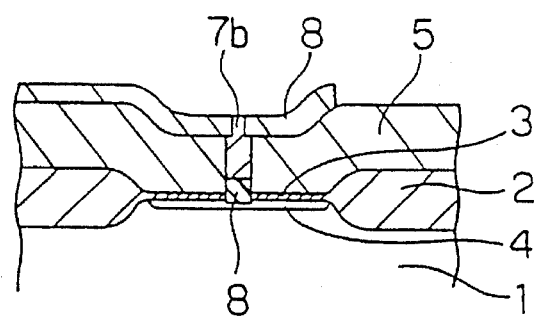

An etch-removal of the metal silicide layer 8 out of the surface except for interconnection areas that are to be formed as the contact and interconnection areas of the device provides a final structure as shown in FIG. 6E and in FIG. 5.

FIGS. 7A–7F illustrate consecutive steps of another method for manufacturing the semiconductor device of FIG. 5.

Figure 7A:
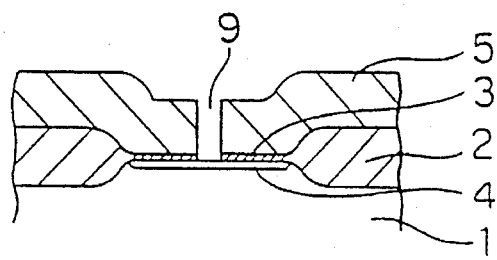
FIGS. 7A–7F are cross-sectional views of a second method for manufacturing the structure shown in FIG. 5.

In FIG. 7A, a 5000 A-thick field oxide film 2 and a 200 A-thick gate oxide film 3 are formed on a P-type silicon substrate 1 using an ordinary LOCOS technology etc similarly to FIG. 6A. An N-type diffused region 4 is formed by implanting arsenic ions with $1E15/cm^2$ in dosage and 50 keV in acceleration energy into the substrate 1. After depositing a 5000 A-thick CVD-$SiO_2$ film, for instance, as an interlayer insulating film 5, a via-hole 9 of 0.3 μm square in size are formed therein at a portion of the N-type diffused region 4.

Figure 7B:
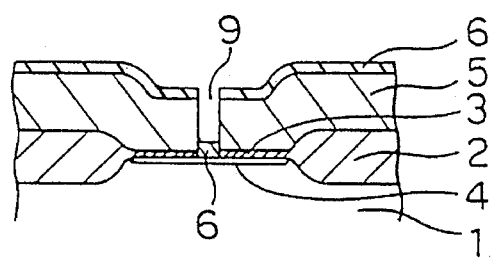

Subsequently, an 800 A-thick titanium film, for instance, is deposited as a metallic film 6 both on a bottom surface of the via-hole 9 and on the interlayer insulating film 5 by use of a collimation sputtering technology as shown in FIG. 7B.

Figure 7C:
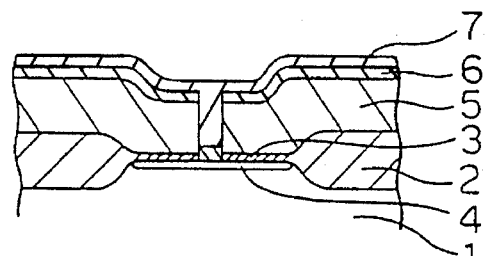

A 2,000 A-thick amorphous silicon film, for instance, is then deposited at 500° C. as a silicon layer 7 for filling up the via-hole 9 as shown in FIG. 7C.

Figure 7D:
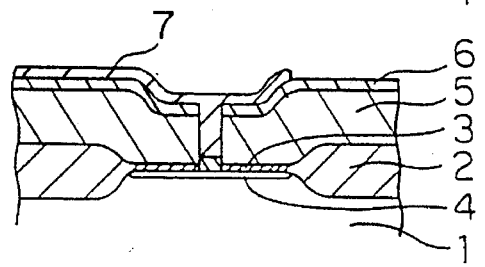

The silicon layer 7 is selectively removed before silicidation reaction through etching for patterning the silicon layer 7 to leave an interconnection layer and a via-plug formed in the via-hole as shown in FIG. 7D.

Figure 7E:
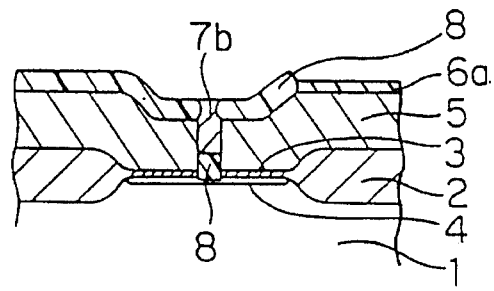
Figure 7F:
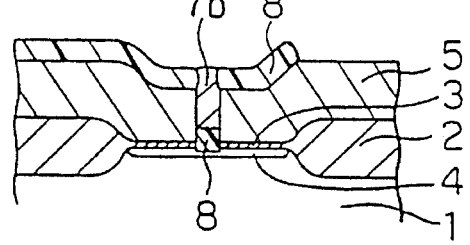

A heat treatment is then carried out at 500°–900° C. to induce a silicidation reaction between the N-type diffused region 4 and the titanium film 6 as well as between the silicon layer 7 and the titanium film 6 to form metal silicide layers 8 as shown in FIG. 7E.

A removal of unreacted titanium films provides the final structure as shown in FIG. 7E and in FIG. 5.

As to the semiconductor device according to the present embodiment as described above, the silicon plug 7b, which connects electrically the bottom surface of the via-hole with the metal silicide layer 8 located on the interlayer insulating film 5, may be doped either by an in-situ gaseous doping technology during a silicon film growth or by a separated ion-implantation technology after the silicon growth.

Refractory and noble metals such as Zr, Hf, V, Mo, Co or Pt are also available as source materials for a metal film instead of titanium films.

Although the above methods are described mainly as to providing an improvement in the contact characteristics of a contact electrode to the diffused region 4. Similar steps may be applicable for the polysilicon gate electrode or other interconnection layers.

Furthermore, an etch-removal of the metal silicide layers or the aluminium layers to leave an interconnection or a contact electrode may be performed after the step for aluminium deposition onto the metal silicide film 8. In addition, the deposition procedures of a silicon film are not restricted to only a CVD or a sputter-deposition technology so long as the via-holes can be filled up.

With semiconductor devices according to the present embodiment, a via-plug made of a silicon layer used for an electric connection between two-level metal silicide interconnection layers provides various advantages as described below.

A first advantage is such that shape failures or defects are reduced after a silicidation reaction even in a fine contact area.

A second advantage is such that the silicidation-induced stress is relaxed because there is no metal film on the inner wall of the via-hole.

A third advantage is such that the thickness of the silicide film can be increased on the bottom of the via-hole substantially without causing any shape defect or stress-induced problem.

A fourth advantage is such that a junction leakage current problem can be alleviated because a silicidation reaction is enhanced both on the top and the bottom of the metal layers contacted to a shallow diffused layer.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor device comprising:
   a silicon substrate;
   a diffused region formed in said silicon substrate;
   an insulating film formed on said substrate and having a via-hole above said diffused region;
   an interconnection layer formed on said insulating film;
   a silicon plug formed within said via-hole in direct contact with an inner wall of said via-hole; and
   a first conductive portion made of a first metal silicide and formed between said diffused region and said silicon plug, said interconnection layer having a second conductive portion made of a second metal silicide which is in direct contact with said silicon plug, said second conductive portion being formed from a reaction between a metal and silicon and being made of a same material as said first metal silicide.

2. A semiconductor device as defined in claim 1 wherein said metal silicide contains a metal selected from a group consisting of Ti, Zr, Hf, V, Mo, Co and Pt.

3. A semiconductor device as defined in claim 1 wherein substantially all of said interconnection layer is made of said second metal silicide.

4. A semiconductor device as defined in claim 1 wherein said first conductive portion is formed within said via-hole beneath said silicon plug.

5. A semiconductor device comprising:
   a substrate;
   a first interconnection layer formed overlying said substrate;
   an interlayer insulating film formed on said interconnection layer and having a via-hole exposing a portion of said first interconnection layer;
   a second interconnection layer formed on said interlayer insulating film and having a first portion disposed above said interlayer insulating film and a second portion disposed within said via-hole; and
   a silicon plug formed within said via-hole in direct contact with an inner wall of said via-hole,
   each of said first portion and said second portion being made of a metal silicide and in direct contact with said silicon plug, said second portion being disposed between said silicon plug and said first interconnection layer.

6. A semiconductor device as defined in claim 5 wherein said metal silicide contains a metal selected from a group consisting of Ti, Zr, Hf, V, Mo, Co and Pt.

7. A semiconductor device as defined in claim 5 wherein at least one of said first and second interconnection layers is made of said metal silicide.

8. A semiconductor device as defined in claim 1 wherein said silicon plug has a top portion in direct contact with said interconnection layer at a side surface of the top portion.

9. A semiconductor device as defined in claim 5 wherein said silicon plug has a top portion in direct contact with said second interconnection layer at a side surface of the top portion.

* * * * *